(12) United States Patent
Innocent et al.

(10) Patent No.: US 10,440,297 B2
(45) Date of Patent: Oct. 8, 2019

(54) IMAGE SENSORS HAVING HIGH DYNAMIC RANGE FUNCTIONALITIES

(71) Applicant: SEMICONDUCTOR COMPONENTS INDUSTRIES, LLC, Phoenix, AZ (US)

(72) Inventors: Manuel Innocent, Wezemaal (BE); Tomas Geurts, Haasrode (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/906,619

(22) Filed: Feb. 27, 2018

(65) Prior Publication Data
US 2018/0191969 A1 Jul. 5, 2018

Related U.S. Application Data

(63) Continuation of application No. 15/184,390, filed on Jun. 16, 2016, now Pat. No. 9,942,492.

(51) Int. Cl.
*H04N 5/353* (2011.01)
*H04N 5/374* (2011.01)
(Continued)

(52) U.S. Cl.
CPC ....... *H04N 5/353* (2013.01); *H01L 27/14643* (2013.01); *H04N 5/3559* (2013.01);
(Continued)

(58) Field of Classification Search
CPC .. H04N 5/37452; H04N 5/353; H04N 5/3275; H04N 5/3592; H04N 5/363; H04N 5/378; H01L 27/14643
(Continued)

(56) References Cited

U.S. PATENT DOCUMENTS

| 8,514,308 | B2 * | 8/2013 | Itonaga | H04N 3/14 348/308 |
| 9,225,919 | B2 * | 12/2015 | Johnson | H04N 5/3535 348/296 |

(Continued)

OTHER PUBLICATIONS

Wang et al., "An 89dB Dynamic Range CMOS Image Sensor with Dual Transfer Gate Pixel," in Proceedings of 2011 International Image Sensor Workshop, paper No. R36, Jun. 8-11, 2011, Jun. 23, 2011, Hokkaido, Japan.

(Continued)

*Primary Examiner* — Marly S Camargo
(74) *Attorney, Agent, or Firm* — Treyz Law Group, P.C.; Tianyi He

(57) ABSTRACT

An image sensor pixel may include a photodiode, a charge storage region, a floating diffusion node, and a capacitor. A first transistor may be coupled between the photodiode and the charge storage region. A second transistor may be coupled between the charge storage region and the capacitor. The photodiode may generate image signals corresponding to incident light. Multiple image signals may be summed at the charge storage region. The second transistor may determine a portion of the image signal that may be sent to the capacitor for storage. The portion of the image signal that is sent to the capacitor may be a low gain signal. A remaining portion of the image signal may be a high gain signal. The image sensor pixel may also include readout circuitry that is configured to readout low and high gain signals stored at the floating diffusion node in a double-sampling readout operation.

19 Claims, 10 Drawing Sheets

(51) Int. Cl.
  *H04N 5/359* (2011.01)
  *H04N 5/363* (2011.01)
  *H04N 5/378* (2011.01)
  *H01L 27/146* (2006.01)
  *H04N 5/355* (2011.01)
  *H04N 5/357* (2011.01)
  *H04N 5/3745* (2011.01)

(52) U.S. Cl.
  CPC ......... *H04N 5/3575* (2013.01); *H04N 5/3592* (2013.01); *H04N 5/363* (2013.01); *H04N 5/378* (2013.01); *H04N 5/37452* (2013.01)

(58) Field of Classification Search
  USPC ......... 348/308, 294–302; 257/291, 292, 223, 257/230, 445; 250/208.1
  See application file for complete search history.

(56) References Cited

U.S. PATENT DOCUMENTS

| | | | |
|---|---|---|---|
| 9,363,450 | B2 | 6/2016 | Nakamura et al. |
| 9,900,481 | B2* | 2/2018 | Geurts ................ H04N 5/2253 |
| 9,942,492 | B2* | 4/2018 | Innocent ................ H04N 5/353 |
| 10,070,079 | B2* | 9/2018 | Hynecek ............. H04N 5/3559 348/296 |
| 10,264,197 | B2* | 4/2019 | Hirota ................ H04N 5/3745 348/294 |
| 2006/0284054 | A1 | 12/2006 | Asaba |
| 2007/0272828 | A1 | 11/2007 | Xu |
| 2008/0210986 | A1* | 9/2008 | Mauritzson ....... H01L 27/14609 257/215 |
| 2010/0165167 | A1 | 7/2010 | Sugiyama et al. |
| 2010/0276572 | A1* | 11/2010 | Iwabuchi .............. H01L 31/101 250/208.1 |
| 2011/0042552 | A1* | 2/2011 | Furuya ................... H01L 27/14 250/208.1 |
| 2012/0188423 | A1 | 7/2012 | Solhusvik |
| 2013/0135486 | A1* | 5/2013 | Wan ....................... H04N 5/765 348/207.99 |
| 2014/0211056 | A1 | 7/2014 | Fan |
| 2015/0009375 | A1 | 1/2015 | Agranov et al. |
| 2015/0244950 | A1 | 8/2015 | Johnson |
| 2016/0100113 | A1 | 4/2016 | Oh et al. |
| 2016/0366350 | A1 | 12/2016 | Roffet et al. |
| 2017/0094203 | A1 | 3/2017 | Barna |
| 2017/0244921 | A1* | 8/2017 | Velichko ................ H04N 5/378 348/296 |
| 2017/0324915 | A1* | 11/2017 | Geurts ................ H04N 5/3532 |
| 2018/0288343 | A1* | 10/2018 | McCarten .......... H04N 5/35581 348/296 |
| 2019/0020839 | A1* | 1/2019 | Velichko ................ H04N 5/378 348/296 |

OTHER PUBLICATIONS

Innocent et al., "Differential image sensor with high common mode rejection," in Proceedings of the 31st European Solid-State Circuits Conference, 2005. ESSCIRC 2005., Sep. 12-16, 2005, pp. 483-486.
Solhusvik et al., "A 1280×960 3.75um pixel CMOS imager with Triple Exposure HDR," in Proceedings of 2009 International Image Sensor Workshop, Jun. 22-28, 2009, Bergen, Norway.
Barna, U.S. Appl. No. 14/870,578, filed Sep. 30, 2015.
Mlinar et al., U.S. Appl. No. 15/145,374, filed May 3, 2016.

* cited by examiner

IMAGE SENSORS HAVING HIGH DYNAMIC RANGE FUNCTIONALITIES

This application is a continuation of U.S. patent application Ser. No. 15/184,390, filed Jun. 16, 2016, which is hereby incorporated by reference herein in its entirety. This application claims the benefit of and claims priority to U.S. patent application Ser. No. 15/184,390, filed Jun. 16, 2016.

BACKGROUND

This relates generally to imaging devices, and more particularly, to imaging devices having compact image sensor pixels with high dynamic range functionalities.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

Typical image pixels contain a photodiode for generating charge in response to incident light. Image pixels may also include a charge storage region for storing charge that is generated in the photodiode. Image sensors can operate using a global shutter or a rolling shutter scheme. In a global shutter, every pixel in the image sensor may simultaneously capture an image, whereas in a rolling shutter each row of pixels may sequentially capture an image.

Image sensors may be equipped with multi-exposure high dynamic range (HDR) functionality, where multiple images are captured with an image sensor at different exposure times. The images are later combined into a high dynamic range image. A HDR image sensor can operate using a rolling shutter operation or a global shutter operation by adding additional sample and hold (S/H) circuitry. However, the additional sample and hold circuitry may take up valuable pixel area, decreasing the amount of active area available for the pixel photodiode. Additionally, in standard HDR image sensor pixels, bright scenes can cause unwanted saturation of the photodiode leading to over saturated image signals.

It would therefore be desirable to be able to provide imaging devices with improved image sensor pixels.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
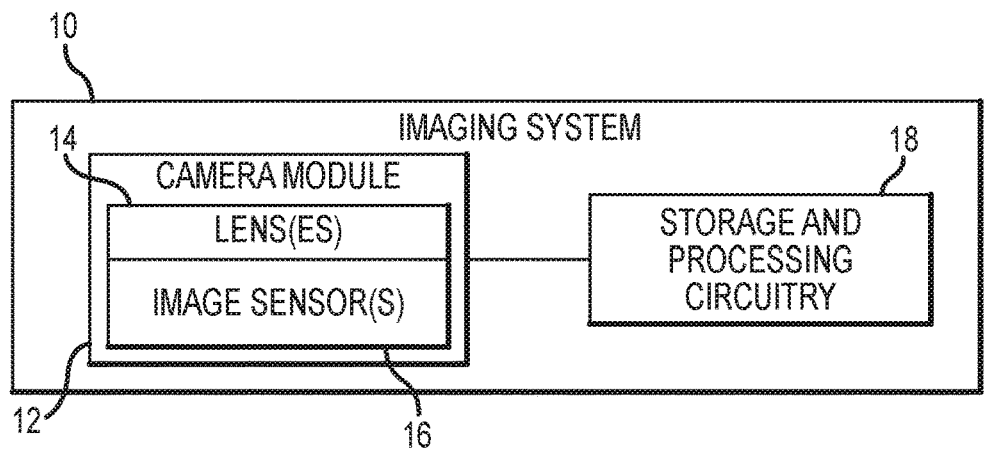
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
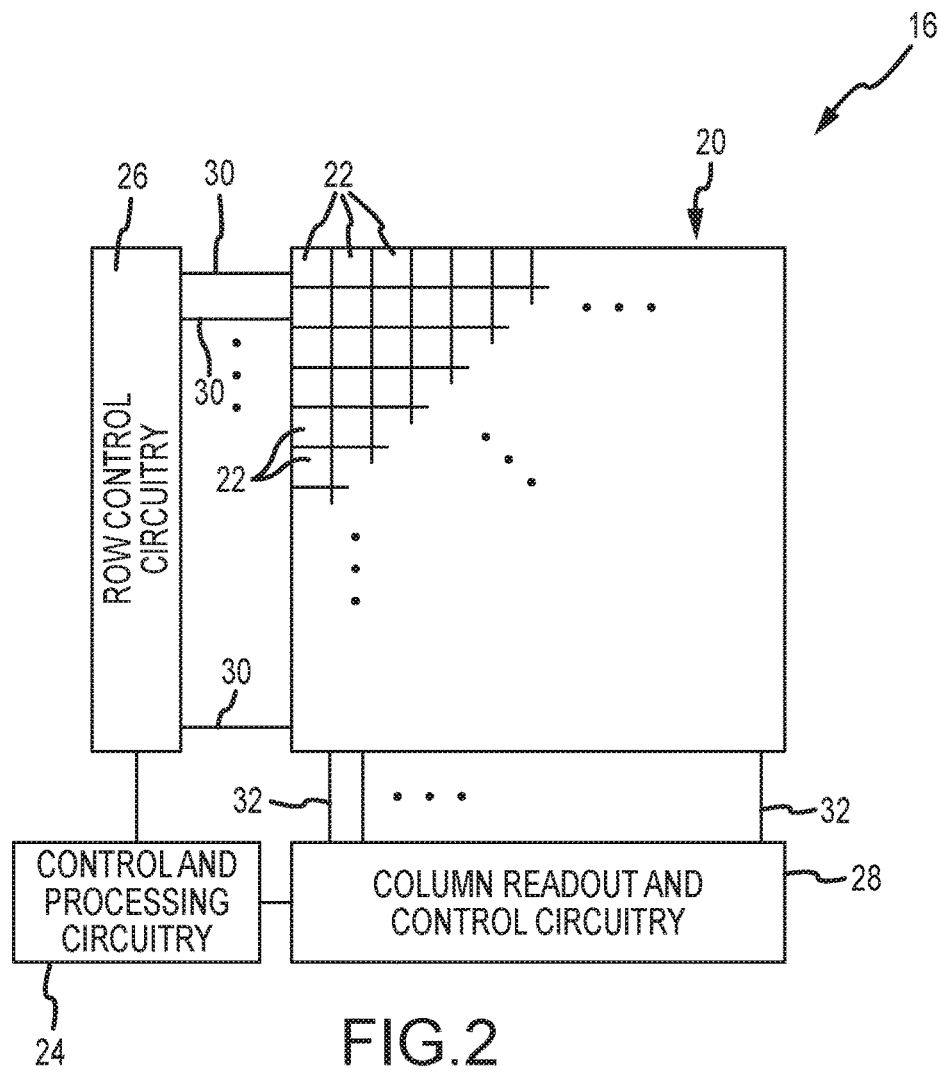
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

Image sensor 16 may be configured to support a global shutter operation (e.g., pixels 22 may be operated in a global shutter mode). For example, the image pixels 22 in array 20 may each include a photodiode, floating diffusion region, and local charge storage region. With a global shutter scheme, all of the pixels in the image sensor are reset simultaneously. A charge transfer operation is then used to simultaneously transfer the charge collected in the photodiode of each image pixel to the associated charge storage region. Data from each storage region may then be read out on a per-row basis, for example.

Figure 3A:
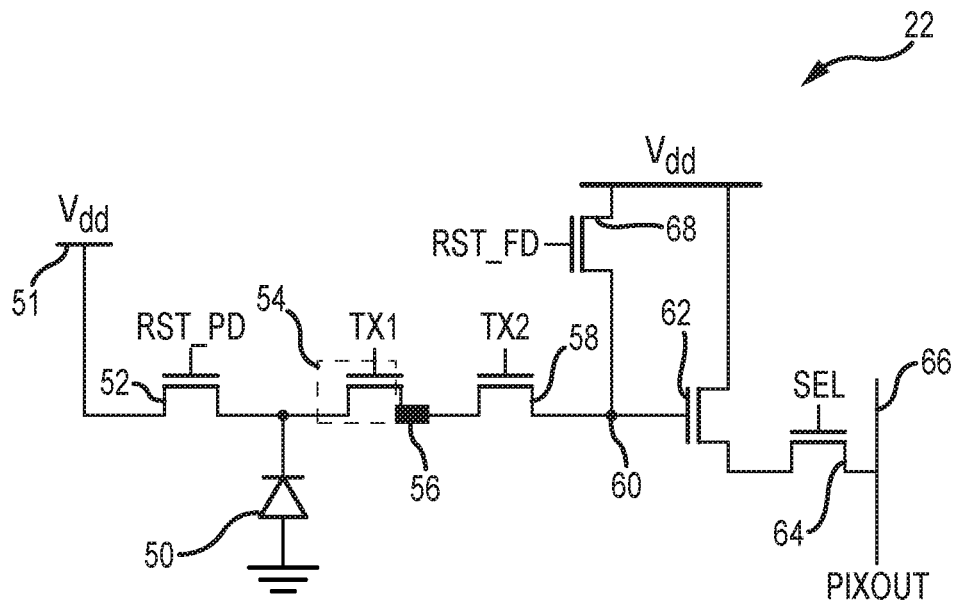
FIGS. 3A and 3B are circuit diagrams of illustrative image sensor pixels configured to integrate image signals at designated storage regions in accordance with an embodiment.

FIG. 3A is a circuit diagram of an illustrative image sensor pixel 22. Pixel may include photosensitive region 50 (e.g., photodiode 50). Photodiode 50 may receive incident light over a period of time (i.e., exposure time) and generate an image signal corresponding to the incident light over the exposure time. In conventional imaging systems, image artifacts may be caused by moving objects, moving or shaking camera, flickering lighting, and objects with changing illumination in an image frame. Such artifacts may include, for example, missing parts of an object, edge color artifacts, and object distortion. Examples of objects with changing illumination include light-emitting diode (LED) traffic signs (which can flicker several hundred times per second) and LED brake lights or headlights of modern cars. Image signals generated with a short integration time and a short exposure time may miss the flickering light (e.g., the blinking light of the LED at a given frequency). However, by spreading the short integration time over a longer exposure time, there is less chance to miss the signal from the flickering light (e.g., pulse light source, LED). Pixel 22 may be designed to reduce artifacts associated flickering lighting by spreading a short integration time over a longer exposure time. To implement flicker mitigation, photodiode 50 may be coupled to voltage source 51 with first supply voltage Vdd through photodiode reset transistor 52 (sometimes referred to herein as anti-blooming transistor 52). When control signal RST_PD is asserted (e.g., pulsed high), photodiode 50 may be reset to first supply voltage Vdd. When control signal RST_PD is deasserted (e.g., pulsed low), photodiode 50 may begin to accumulate charge from incident light.

Subsequent to photodiode reset, a given integration period may begin and photodiode 50 may begin generating and storing an image signal. Pixel 22 may include first transfer transistor 54 and storage region 56. When the given integration period ends, first transfer transistor 54 may transfer the image signal stored at photodiode 50 to storage region 56 integral with transfer transistor 54. The time between the beginning and the end of the given integration period may be referred to as a first integration time period. Transfer transistor 54 may include a source terminal, a drain terminal, a gate terminal, and a channel region. Storage region 56 may be a doped-semiconductor region (e.g., a doped silicon region formed in a silicon substrate by ion implantation, impurity diffusion, or other doping techniques) that has charge storage capabilities (e.g., a capacitance). Photodiode 50 may be connected to a first terminal (e.g., a source or drain terminal) of transistor 54. Storage region 56 may be connected to a second terminal that opposes the first terminal. As an example, if the first terminal is the source terminal, the second terminal may be the drain terminal, or vice versa. Control signal TX1 may control both a flow of charge across the channel of transistor 54 and a flow of charge into storage region 56. When control signal TX1 is asserted, image signals stored in photodiode 50 may pass through the channel region of transistor 54 and into storage region 56. Control signal TX1 may be subsequently deasserted and photodiode 50 may be reset to a supply voltage using control signal RST_PD.

A second integration period may follow the first integration period. Photodiode 50 may generate an image signal corresponding to the second integration period. The image signals from the second integration period may be transferred to storage region 56 using control signal TX1. The image signal from the second integration period may be integrated (e.g., summed or added) with the image signal from the first integration period. The integrated image signal stored at storage region 56 may be said to have an effective integration time period. The effective integration time period is the summation of the first integration time period and a second integration time period (corresponding to the time between the beginning and end of the second integration period). In general, any number of desired integration processes (e.g., transferring image signals from distinct integration periods to storage region 56 for summation) may occur. The effective integration period may be generally defined as summation of all of the distinct integration time periods, over which all of the respective individual image signals were generated. After a desired number of integration periods and integration of the corresponding image signals at storage region 56, control signal TX1 may be deasserted to add a last image signal. By breaking up the effective integration period during an image frame into shorter, non-continuous integration periods that span a longer exposure time, image artifacts caused by moving objects, flickering lighting, and objects with changing illumination may be minimized without compromising pixel integration time (i.e., while maintaining the desired total integration time).

Pixel 22 may include second transfer transistor 58. Transfer transistor 58 may have a gate terminal that is controlled by second transfer control signal TX2. Transfer control signal TX2 may be pulsed high to transfer charge from storage region 56 into floating diffusion region 60. Floating diffusion region 60 may be a doped semiconductor region (e.g., a region in a silicon substrate that is doped by ion implantation, impurity diffusion, or other doping processes), for example. Floating diffusion region 60 may serve as another storage region for storing charge during image data gathering operations. Floating diffusion region 60 may have a charge storage capacity (capacitance).

Pixel 22 may include readout circuitry that includes source follower transistor 62 and row select transistor 64. Transistor 64 may have a gate that is controlled by row select control signal SEL. When control signal SEL is asserted, transistor 64 is turned on and a corresponding signal PIXOUT (e.g., an output signal having a magnitude that is proportional to the amount of charge at floating diffusion node 60) is passed onto column readout path 66 (sometimes referred to herein as bus line 66). Pixel 22 may include floating diffusion reset transistor 68. Transistor 68 may have a gate that is controlled by floating diffusion reset control signal RST_FD. Transistor 68 couples floating diffusion region 60 to a second supply voltage (e.g., Vdd) that may the same as or different from first supply voltage Vdd. When control signal RST_FD is asserted, transistor 68 is turned on and floating diffusion node is reset to the second supply voltage level.

Subsequent to image signal readout by the readout circuitry and floating diffusion region reset, a new integrated image signal may be transferred from storage region 56 to floating diffusion region 60. Conversion of incident light into corresponding image signals at photodiode 50 may occur simultaneously with image signal readout, if desired. Integration of multiple image signals at storage diode 56 may occur simultaneously with image signal readout, if desired.

A correlated double sampling readout process may be used to sample the charge from charge storage region 56. First, floating diffusion region 60 may be reset to the second supply voltage level by asserting control signal RST_FD. Reset voltage level stored at floating diffusion 60 may then be sampled using the readout circuitry. Control signal RST_FD may be deasserted. Summed image signal stored at storage region 56 may then be transferred into floating diffusion region 60 by asserting control signal TX2. Image signal stored at floating diffusion 60 may be sampled using the readout circuitry. The signals may be subtracted to account for noise associated with the reset level of the floating diffusion region.

Figure 3B:
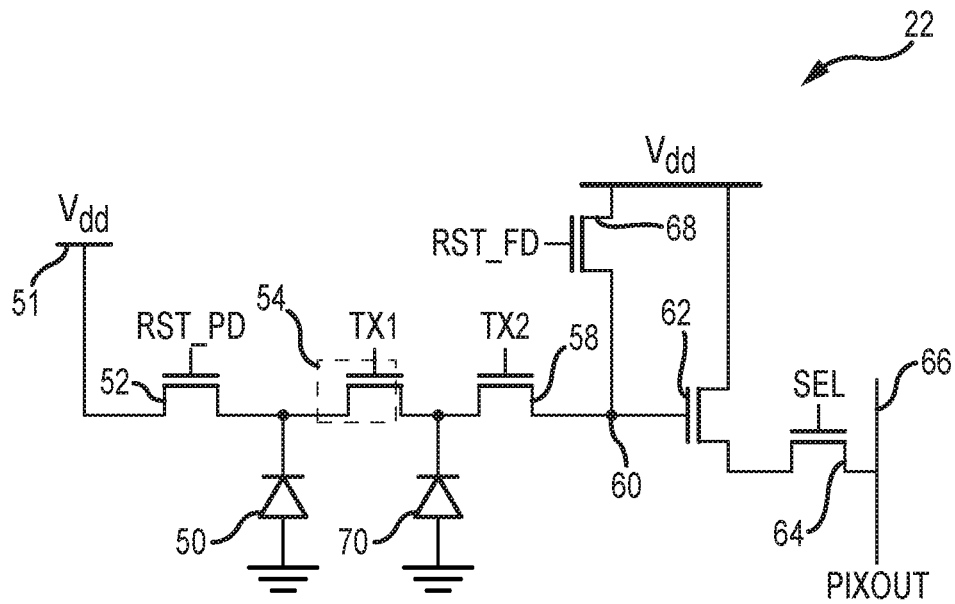

As an example of an alternative configuration of pixel 22, FIG. 3B shows pixel 22 with storage diode 70. Storage diode 70 may be an alternative to storage region 56 shown in FIG. 3A. Storage diode 70 may be adjacent to and interposed between first transfer transistor 56 and second transfer transistor 58. If desired, a storage structure may be formed in between transistors 54 and 58 instead of a storage diode. Storage diode 70 may be formed into a transistor structure (e.g., formed as a channel region of a transistor). The transistor structure, sometimes referred to as a storage gate, may have a gate terminal controlled by a storage gate control signal. The storage gate control signal may control a flow of charge into and out of the storage gate. Pixel 22 as shown in FIG. 3B is operated in a similar manner as pixel 22 as shown in FIG. 3A.

In FIGS. 3A and 3B, image signals may be integrated at storage region 56 and storage diode 70. Storage region 56 and storage diode 70 have lower dark current than diffusion region 60. When image signals are summed at storage region 56 and storage diode 70 instead of floating diffusion 60, less image degradation occurs during the integration process of multiple image signals. The storage of summed image signals at storage region 56 and storage diode 70 also allows for a correlated double sampling readout, which reduces readout noise.

Generally, storage structures (e.g., storage region 56 and storage diode 70) may be formed between any two transfer transistors (e.g., transistors 54 and 58) to allow for image signal integration in a low dark current environment and correlated double sampling readout. However, in FIGS. 4-8, the storage structures are only illustrated and discussed generally as storage structure 57, in order to avoid unnecessarily obscuring the present embodiments and drawings of FIGS. 4-8. Storage structure 57 may be one of storage region 56, storage diode 70, or any other storage structure that serve the purposes set forth by the present embodiments.

Figure 4:
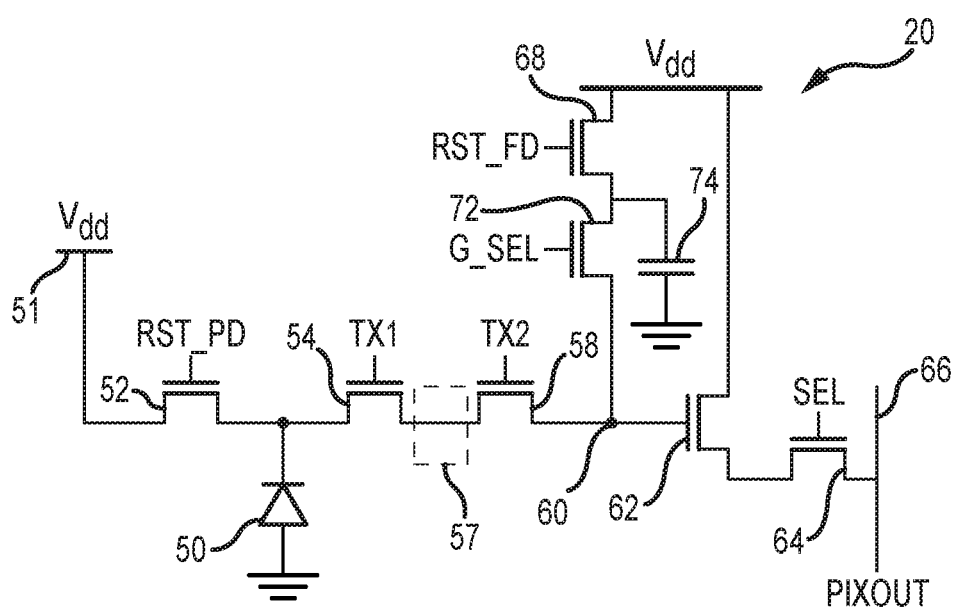
FIG. 4 is a circuit diagram of an illustrative image sensor pixel configured to integrate image signals at a designated storage region with dual-gain operation in accordance with an embodiment.

FIG. 4 shows an embodiment of the invention enabling pixel 22 in FIG. 3A or 3B for dual-gain operations. Pixel 22 may include gain select transistor 72 and low gain capacitor 74. Transistor 72 may have a gate terminal controlled by gain select control signal G_SEL. When control signal G_SEL is asserted, transistor 72 is turned on and low gain capacitor 74 may be coupled to floating diffusion 60. Both control signals RST_FD and G_SEL may be asserted to reset floating diffusion region 60 to the supply voltage level.

During operation of pixel 22, second transfer transistor 58 may be set with an overflow threshold. Storage structure 57 may be coupled to transistor 58. Storage structure 57 may store integrated image signals from combining individual signals across multiple distinct integration periods. When integrated image signals at storage structure 57 (e.g., storage region or storage diode) exceed the overflow threshold, charge may overflow to floating diffusion region 60. Typically, transistor 72 will remain on during any integration process occurring at storage structure 57. Since transistor 72 is conductive, the overflowing charge will be stored on low gain capacitor 74, while the charge below the overflow threshold will remain in storage structure 57

During readout, the image signals on both low gain capacitor 74 and storage region 57 may be sampled. First, the low gain image signal stored on capacitor 74 may be sampled by the readout circuitry, which includes transistors 62 and 64. Next, the floating diffusion may be reset and a reset voltage level may be sampled. The reset voltage level may be subtracted from the low gain image signal for a double sampling read with uncorrelated noise of the low gain image signal. Alternatively, an external offset calibrated for the reset voltage level may be used for the low gain image signal. After sampling the reset voltage level, the high gain image signal (on storage region 57) may be sampled. Prior to reading out the high gain image signal, control signal G_SEL may be deasserted. The high gain image signal readout is a correlated double sampling readout. A high dynamic range image may be constructed using the low gain image signal and high gain image signal.

Photodiode 50, supply voltage source 51, photodiode reset transistor 52, transfer transistor 54, and storage structure 57 may be used in combination with any subsection of a pixel configuration having a resettable charge storage region and readout circuitry in accordance with the embodiments of FIGS. 3A and 3B.

Figure 5A:
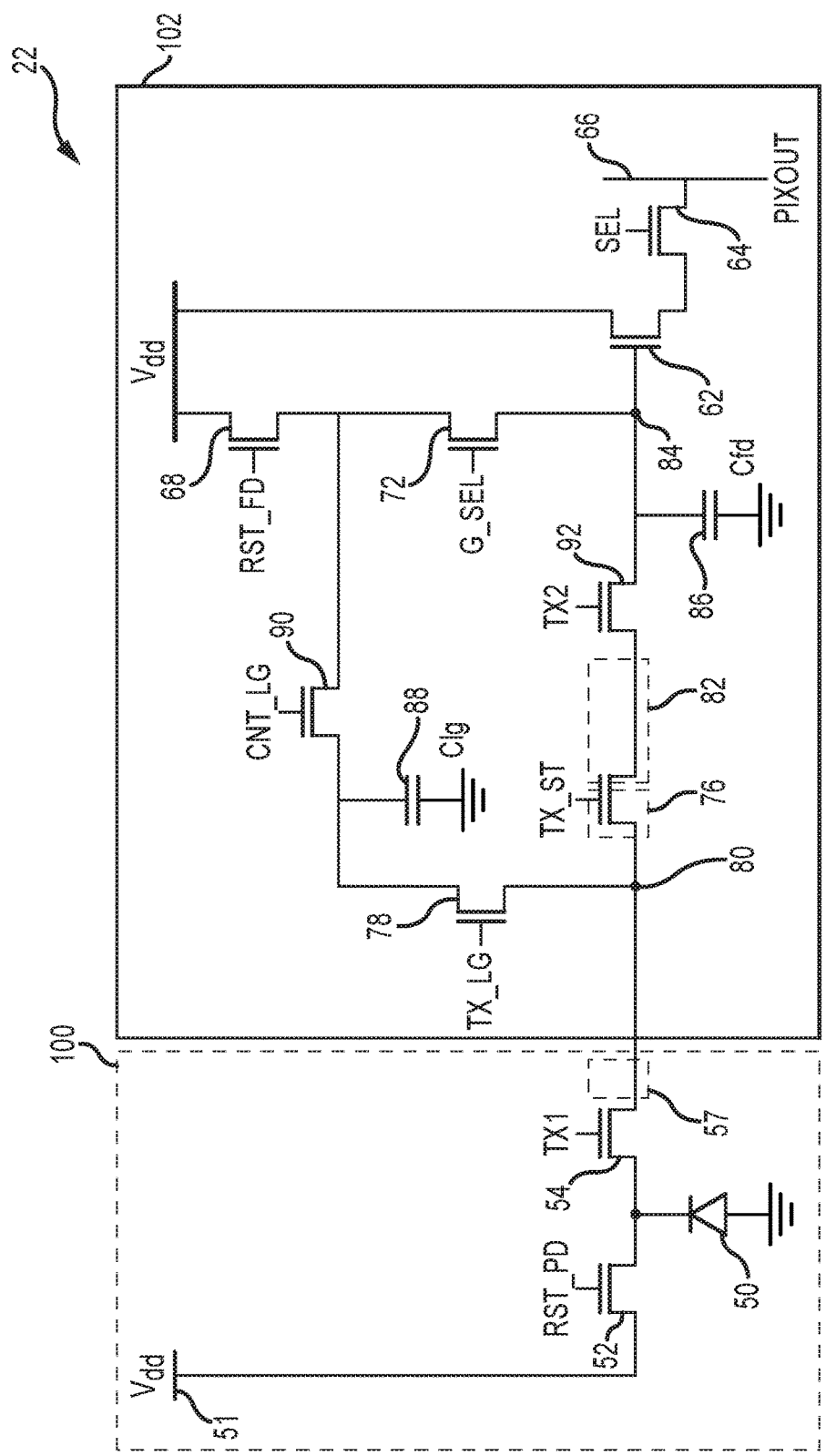
FIG. 5A is a circuit diagram of an illustrative compact image sensor pixel configured to integrate image signals at a designated storage region with high dynamic range imaging capabilities in accordance with an embodiment.

As an example, FIG. 5A shows pixel 22 including portion 100 and portion 102. Portion 100 may include photodiode 50, supply voltage source 51, photodiode reset transistor 52, transfer transistor 54, and storage structure 57. Integrated image signals may be temporarily stored at storage structure 57 through the previously described process in FIG. 3A. Similarly, storage structure 57 may be coupled to a source or drain terminal of transistor 54.

Portion 102 may include resettable charge storage regions 80 and 84. Region 80 (sometimes referred to herein as integration node 80) may be configured to integrate multiple image signals generated from distinct integration periods from photodiode 50. Region 84 (sometimes referred to herein as floating diffusion region 84) may be configured to temporarily store image signals that are ready to be sampled. Floating diffusion region 84 may serve as another storage region for storing charge during image data gathering operations. Floating diffusion region 84 may have a charge storage capacity (capacitance) as shown by capacitor 86 having capacitance Cfd. Pixel 22 may include in portion 102 readout circuitry that reads out image signals stored at floating diffusion region 84 using source follower transistor 62, row select transistor 64, and bus line 66. Corresponding image signal PIXOUT on bus line 66 may be correlated to the image signals stored at floating diffusion region 84. The aforementioned features within portions 100 and 102 of pixel 22 are analogous to features shown and discussed previously in FIG. 3A.

Pixel 22 in FIG. 5A may include additional features to supplement the functionality of pixel 22 in FIG. 3A. Pixel may include integrated charge transfer transistor 76. Transistor 76 may have a gate terminal that is controlled by stored charge transfer control signal TX_ST. Pixel 22 may include a low gain transfer transistor 78. Transistor 78 may have a gate terminal that is controlled by low gain transfer control signal TX_LG. After a desired number of integration periods, an integrated image signal may be stored at storage structure 57, through a process previously discussed in detail in FIG. 3A. Storage structure 57 may share node 80. The integrated image signal may also be said to be summed at node 80. Transistor 78 may set an overflow charge barrier (e.g., a voltage threshold). When the integrated image signal stored at storage structure 57 exceeds the threshold, a first portion of the integrated image signal that exceeds the threshold may be transferred to low gain capacitor 88 through transistor 78. Low gain capacitor 88 may store the transferred image signals as a low gain image signal until the low gain signal is ready to be transferred out of low gain capacitor 88. The low gain signal may be readout at a subsequent time. A second portion of the integrated image signal remains at storage structure 57

Additionally, transfer transistor 76 may couple storage region 57 to additional storage region 82. When control signal TX_ST is asserted (e.g., provides a logic high), the second portion of the summed image signal stored at storage structure 57 is transferred to additional storage structure 82. Additional storage structure 82, similar to storage structure 57, may be a storage region, a storage diode, a storage gate, or any other storage structure. The storage region or storage diode may include previously discussed features, such as being a doped-semiconductor region. The portion of the integrated image signal stored at additional storage structure 82 may be referred to as a high gain image signal. The high gain image signal is stored at storage structure 82 until the high gain image signal is ready to be read out.

Pixel 22 may include floating diffusion reset transistor 68 and gain select transistor 72. Transistor 68 may have a gate terminal controlled by floating diffusion reset control signal RST_FD. Transistor 72 may have a gate terminal controlled by gain select control signal G_SEL. Floating diffusion region 84 may be coupled to a voltage supply source having a supply voltage level (e.g., Vdd). When control signals RST_FD and G_SEL are both asserted, floating diffusion region 84 may be connected to the voltage supply source and reset to the supply voltage level.

Pixel 22 may include low gain signal connection transistor 90. Transistor 90 may have a gate terminal that is controlled by connection control signal CNT_LG. When control signal RST_FD is deasserted and control signals CNT_LG and G_SEL are both asserted, the low gain image signal stored at capacitor 88 may be transferred to floating diffusion region 84 for subsequent readout. Pixel 22 may include second transfer transistor 92. Transistor 92 may have a gate terminal that is controlled by transfer control signal TX2. When control signal G_SEL is deasserted and control signal TX2 is asserted, the high gain image signal stored at storage structure 82 may be transferred to floating diffusion region 84 for subsequent readout. A high dynamic range image may be constructed using the low gain image signal and high gain image signal.

Figure 5B:
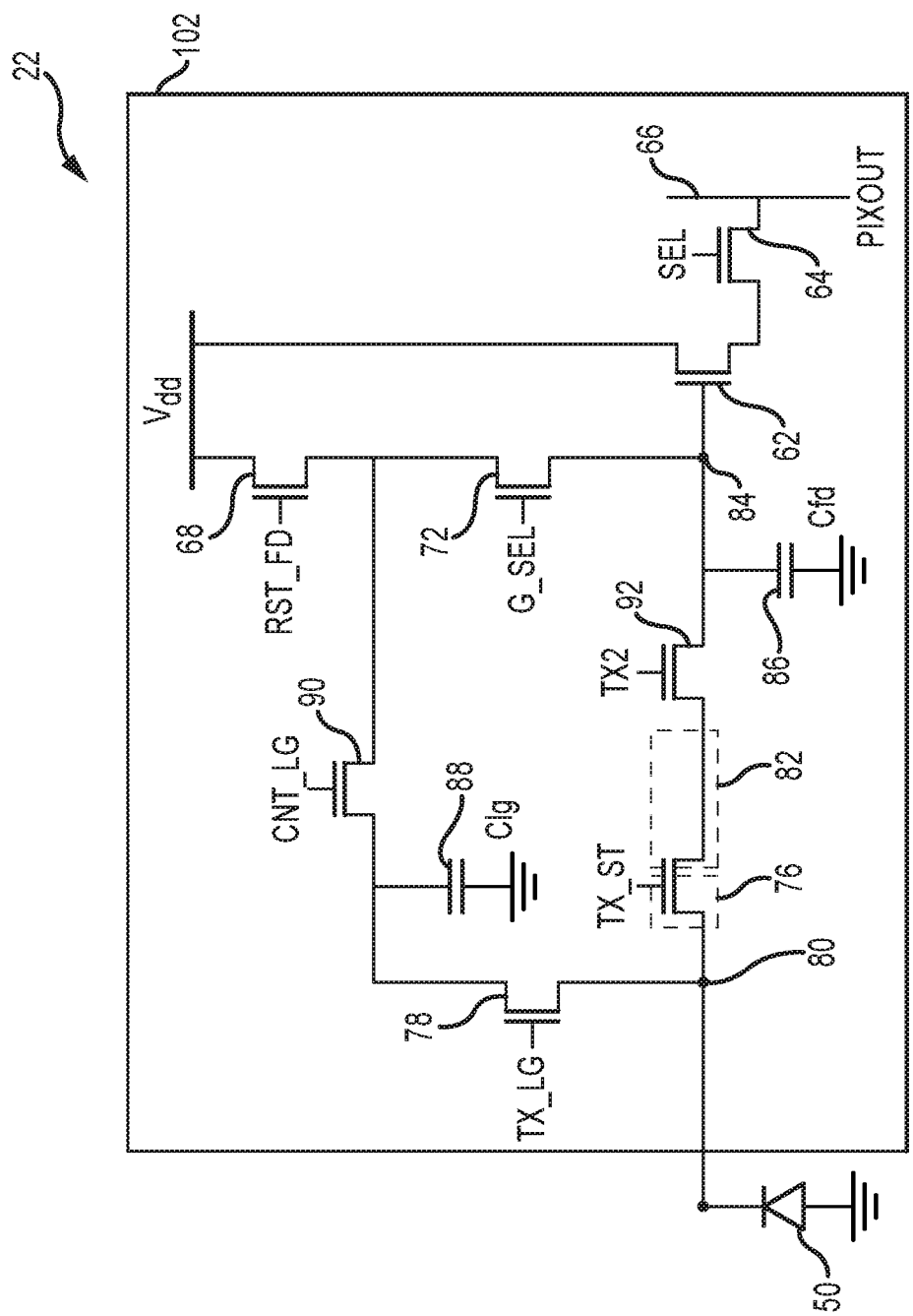
FIG. 5B is a circuit diagram of an illustrative compact image sensor pixel with high dynamic range imaging capabilities in accordance with an embodiment.

In an alternative embodiment, portion 100 of FIG. 5A may be replaced by a photodiode (e.g., photodiode 50) as shown in FIG. 5B. Pixel 22 shown in FIG. 5B is more compact than Pixel 22 as shown in FIG. 5A because it lacks the transistors 52 and 54, and storage region 57 as well as the corresponding electrical connections. Pixel 22 as shown in FIG. 5B may be operated using a similar method as Pixel 22 as shown in FIG. 5A. Pixel 22 in FIG. 5B may operate in a HDR mode as described in FIG. 5A using low and high gain image signals stored in portion 102. In this way, pixel 22 in FIG. 5B may be a compact pixel specialized to operate in the HDR mode.

Figure 6A:
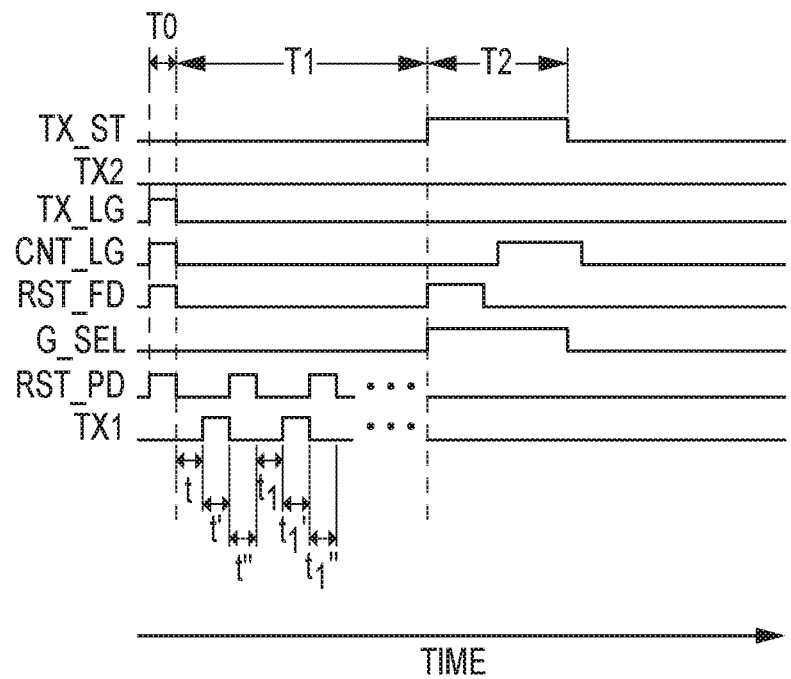
FIGS. 6A and 6B are timing diagrams for operating the illustrative image sensor pixel shown in FIG. 5A in accordance with an embodiment.
Figure 6B:
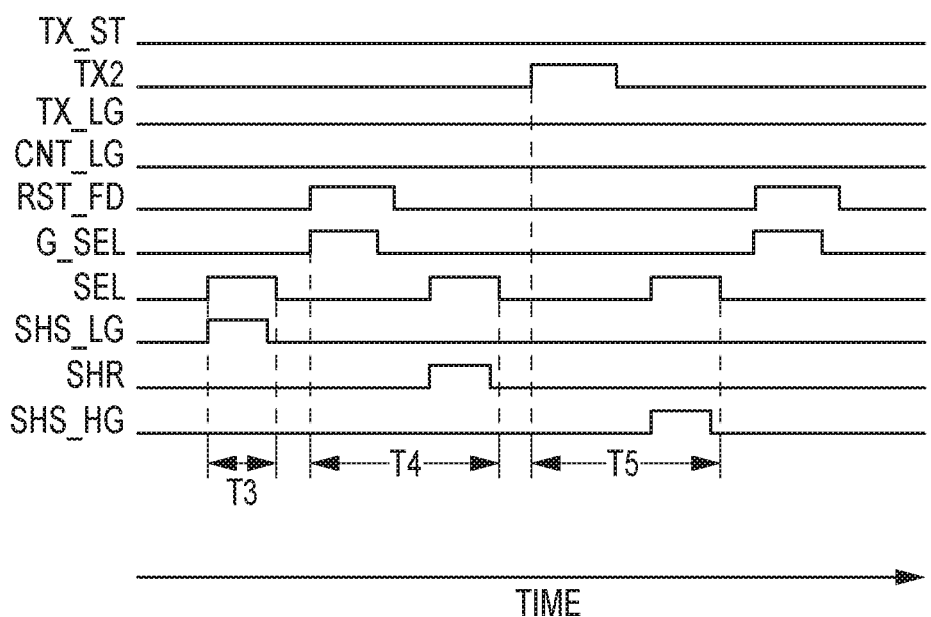

FIGS. 6A and 6B show timing diagrams for operating the illustrative image sensor pixel shown in FIG. 5A. FIG. 6A shows a timing diagram for image signal generation operation. FIG. 6A includes period T0, during which control signal RST_PD may be asserted to reset photodiode 50 to a reset voltage level. During period T0, control signals TX_LG, CNT_LG, and RST_FD may also be asserted to reset storage region 57 and capacitor 88 to the reset voltage level. During period T1, photodiode 50 may begin to generate image signals corresponding to incident light in multiple distinct integration periods. Distinct image signals generated during the distinct integration periods may be continually summed at storage structure 57 by asserting control signal TX1 for transistor 54.

More specifically, period T1 may include periods t, t', and t". After photodiode 50 is reset in period T0, period t may start during which control signals RST_PD and TX1 are both deasserted. During period t, photodiode 50 may receive incident light (e.g., receive light exposure) and generate a corresponding image signal. After a desired length of time for light exposure, period t ends and period t' may begin. During period t', control signal TX1 may be asserted to transfer the corresponding image signal to storage structure 57. Additional image signals generated at photodiode 50 during t' may also be transferred to storage structure 57. As a result, the integration time period may begin at the beginning of period t and ends when period t' ends. In other words, the integration time period may be the sum of time periods t and t'. After the corresponding image signal has been transferred, period t' ends and period t" may begin. During period t", control signal TX1 may be deasserted and control signal RST_PD may be asserted. Photodiode 50 is reset once again, such that period $t_1$" may begin. Periods $t_1$, $t_1$', and $t_1$" may occur similar to periods t, t', and t", respectively. In general, any desired number of periods $t_n$, $t_n$', and $t_n$" may occur. During period $t_n$', image signals generated during periods $t_1$ to $t_n$ are all summed at storage structure 57. After the desired number of periods have occurred, period T1 may end.

During period T1, if at any time, the image signals stored at storage structure 57 exceeds the voltage threshold set by transistor 78, a portion of the image signals may be stored at capacitor 88 as a low gain image signal.

At the end of period T1, the low gain signal may be stored at capacitor 88 and the high gain signal may be stored at storage structure 57. Period T2 may begin by asserting control signals TX_ST, G_SEL, and RST_FD. When control signal TX_ST is asserted, the high gain signal stored at storage structure 57 may be transferred to storage structure 82. Control signal G_SEL may be continually asserted during period T2 to allow either a reset voltage level or the low gain signal to be transferred to floating diffusion region 84. When control signal RST_FD is asserted, floating diffusion region 84 may be reset to the reset voltage level. After the floating diffusion region 84 is reset, control signal RST_FD may be deasserted and control signal CNT_LG may be asserted to transfer the low gain signal to floating diffusion region 84 for readout.

FIG. 6B shows a timing diagram for image signal readout operation. During period T3, the low gain signal stored at floating diffusion node 84 may be readout by asserting control signal SEL. When control signal SEL is asserted, an image pixel output corresponding to the low gain signal is generated. The image pixel output corresponding to the low gain signal may be sent to sample and hold circuitry by enabling SHS_LG. Control signals SEL and SHS_LG may be deasserted following readout of the low gain signal. During period T4, the floating diffusion region 84 may be reset to the reset voltage level by asserting control signals RST_FD and G_SEL. The reset voltage level may be read out similarly by asserting control signal SEL. Sample and hold circuitry may store the reset voltage level by asserting control signal SHR. During period T5, the high gain signal may be transferred to floating diffusion region 84 by asserting control signal TX2. The high gain signal may be similarly readout by asserting control signal SEL. Sample and hold circuitry may store an image pixel output corresponding to the high gain signal by asserting control signal SHS_HG. Floating diffusion region 84 may be reset once more following high gain signal readout by asserting control signals RST_FD and G_SEL.

Figure 7A:
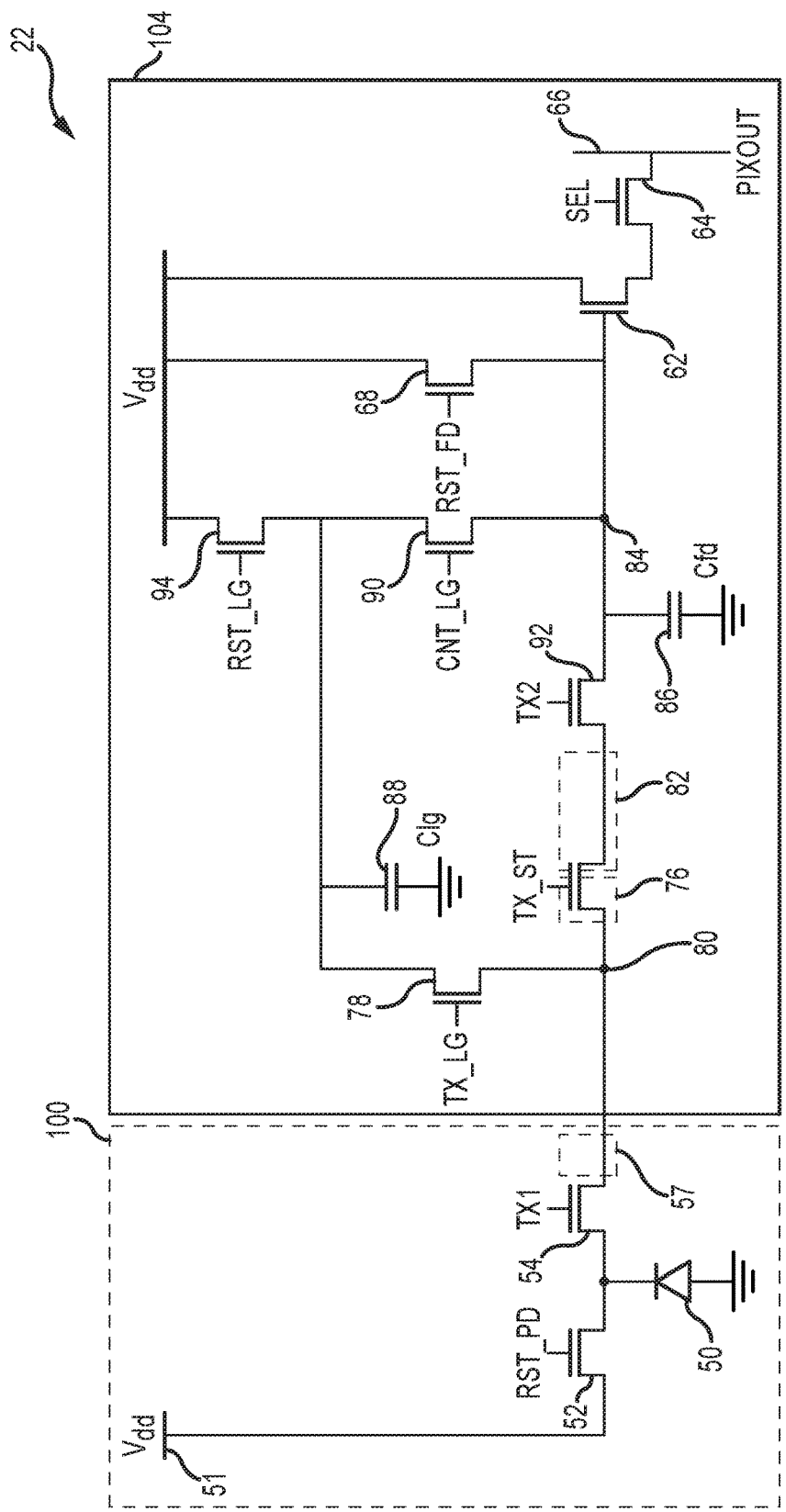
FIG. 7A is a circuit diagram of an illustrative compact image sensor pixel configured to integrate image signals at a designated storage region with high dynamic range imaging capabilities in accordance with an embodiment.

FIG. 7A shows a circuit diagram of an alternative configuration of FIG. 5A. Pixel 22 in FIG. 7A may include portion 100 that is identical to portion 100 of FIG. 5A and portion 104 that is similar to portion 102 of FIG. 5A. As discussed previously, circuitry included in portion 100 may be combined with any pixel circuitry having at least a resettable charge storage region and readout circuitry to implement low-noise high dynamic range pixel operation. Portion 100 may include photodiode 50, supply voltage source 51, photodiode reset transistor 52, transfer transistor 54, and storage structure 57. Integrated image signals may be temporarily stored at storage structure 57 through the previously described process in FIG. 3A. Similarly, storage structure 57 may be coupled to a source or drain terminal of transistor 54.

Portion 104 may include resettable charge storage regions 80 and 84. Integration node 80 may be configured to integrate multiple image signals generated from distinct integration periods from photodiode 50. Floating diffusion region 84 may be configured to temporarily store image signals that are ready to be sampled. Floating diffusion region 84 may serve as another storage region for storing charge during image data gathering operations. Floating diffusion region 84 may have a charge storage capacity (capacitance) as shown by capacitor 86 having capacitance Cfd. Pixel 22 may include in portion 104 readout circuitry that reads out image signals stored at floating diffusion region 84 using source follower transistor 62, row select transistor 64, and bus line 66. Corresponding image signal PIXOUT on bus line 66 may be correlated to the image signals stored at floating diffusion region 84. The aforementioned features within portions 100 and 104 of pixel 22 are analogous to features shown and discussed previously in FIG. 3A.

Pixel may include integrated charge transfer transistor 76. Transistor 76 may have a gate terminal that is controlled by stored charge transfer control signal TX_ST. Pixel 22 may include a low gain transfer transistor 78. Transistor 78 may have a gate terminal that is controlled by low gain transfer control signal TX_LG. After a desired number of integration periods, an integrated image signal may be stored at storage structure 57, through a process previously discussed in detail in FIG. 3A. Storage structure 57 may share node 80. The integrated image signal may also be said to be summed at node 80. Transistor 78 may set an overflow charge barrier (e.g., a voltage threshold). When the integrated image signal stored at storage structure 57 exceeds the threshold, a first portion of the integrated image signal that exceeds the threshold may be transferred to low gain capacitor 88 through transistor 78. Low gain capacitor 88 may store the transferred image signals as a low gain image signal until the low gain signal is ready to be read out. A second portion of the integrated image signal remains at storage structure 57

Additionally, transfer transistor 76 may couple storage region 57 to additional storage region 82. When control signal TX_ST is asserted (e.g., provides a logic high), the second portion of the integrated image signal stored at storage structure 57 is transferred to additional storage structure 82. Additional storage structure 82, similar to storage structure 57, may be a storage region, a storage diode, a storage gate, or any other storage structure. The storage region or storage diode may include previously discussed features, such as being a doped-semiconductor region. The portion of the summed image signal stored at additional storage structure 82 may be referred to as a high gain image signal. The high gain image signal is stored at storage structure 82 until the high gain image signal is ready to be read out.

The aforementioned features of portion 104 of FIG. 7A are identical to the analogous features of portion 102 of FIG. 5A. However, in addition to the aforementioned features of portion 104, portion 104 may include low gain signal reset transistor 94. Transistor 94 may have a gate terminal that is coupled by low gain reset control signal RST_LG. Transistor 94 may directly couple a voltage supply having a supply voltage to capacitor 88, which stores low gain image signals. When control signal RST_LG is asserted, capacitor 88 may be reset to the supply voltage. Pixel 22 may include floating diffusion reset transistor 68 in portion 104. Floating diffusion reset transistor 68 directly couples the voltage supply to floating diffusion region 84. Transistor 68 may have a gate terminal that is controlled by floating diffusion reset control signal RST_FD. When control signal RST_FD is asserted, floating diffusion region 84 may be reset to the supply voltage. Pixel 22 may include in portion 104 low gain signal connection transistor 90. Transistor 90 may directly couple capacitor 88 to floating diffusion region 84. Transistor 90 may have a gate terminal that is controlled by connection control signal CNT_LG. When control signal control signal CNT_LG is asserted, the low gain image signal stored at capacitor 88 may be transferred to floating diffusion region 84 for subsequent readout. A high dynamic range image may be constructed using the low gain image signal and high gain image signal.

Figure 7B:
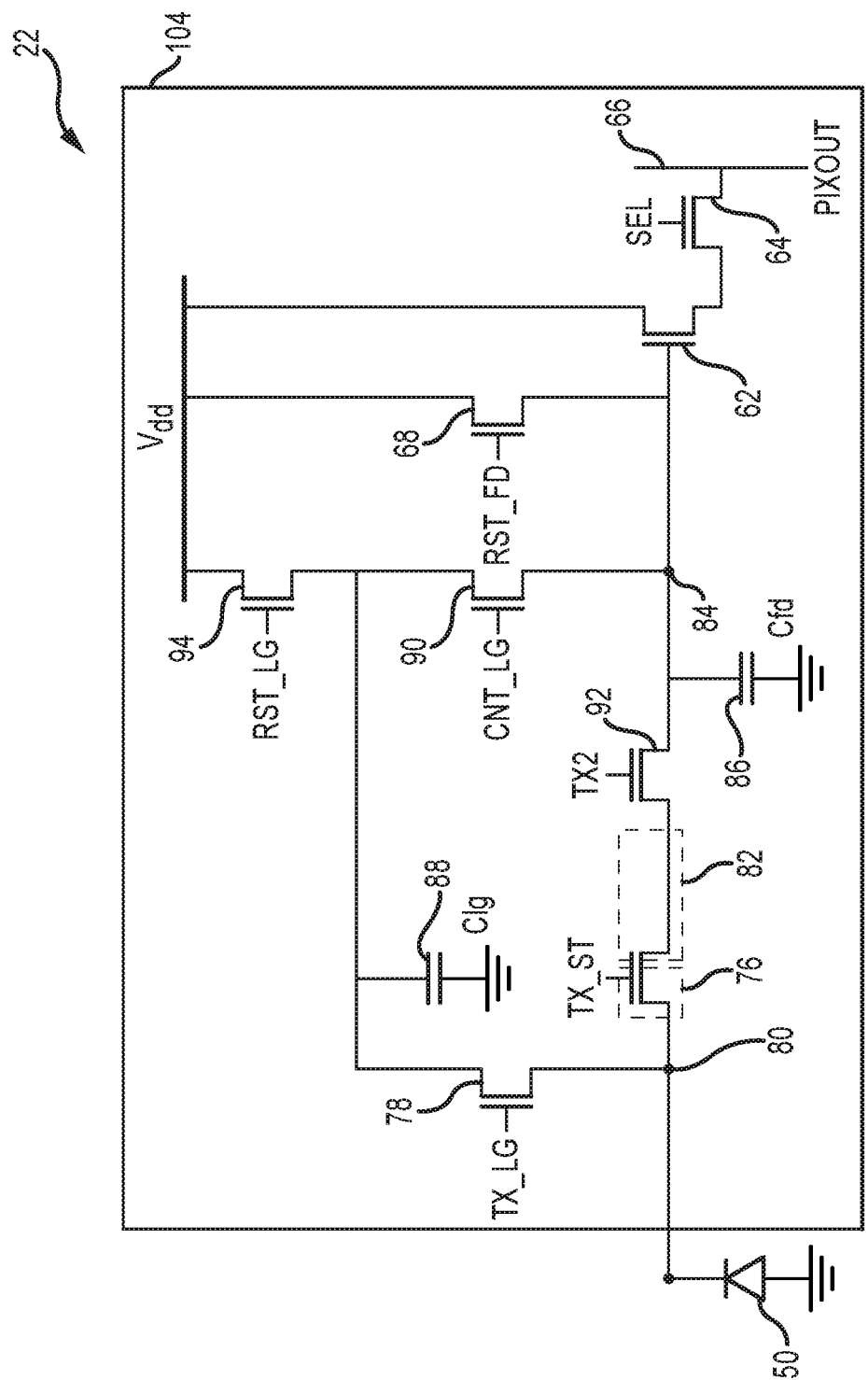
FIG. 7B is a circuit diagram of an illustrative compact image sensor pixel with high dynamic range imaging capabilities in accordance with an embodiment.

In an alternative embodiment, portion 100 of FIG. 7A may be replaced by a photodiode (e.g., photodiode 50) as shown in FIG. 7B. Pixel 22 shown in FIG. 7B is more compact than Pixel 22 as shown in FIG. 7A because it lacks the transistors 52 and 54, and storage region 57 as well as the corresponding electrical connections. Pixel 22 as shown in FIG. 7B may be operated using a similar method as Pixel 22 as shown in FIG. 7A. Pixel 22 in FIG. 7B may operate in a HDR mode as described in FIG. 7A using low and high gain image signals stored in portion 104. In this way, pixel 22 in FIG. 7B may be a compact pixel specialized to operate in the HDR mode.

Figure 8A:
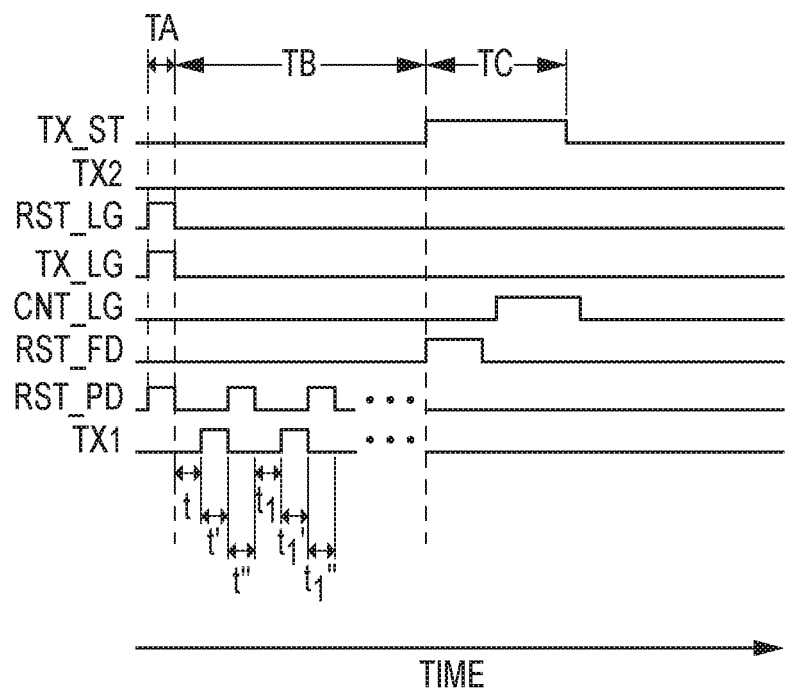
FIGS. 8A and 8B are timing diagrams for operating the illustrative image sensor pixel shown in FIG. 7A in accordance with an embodiment.
Figure 8B:
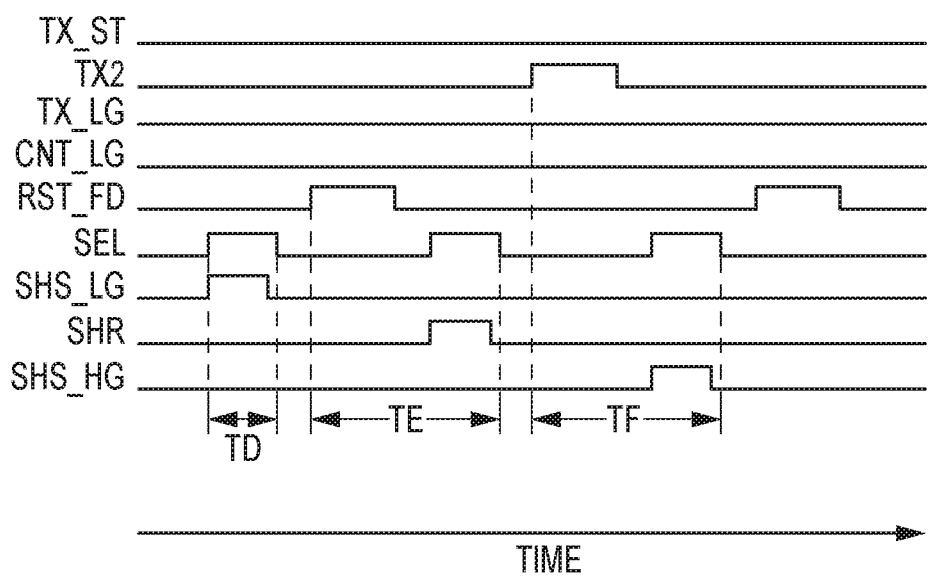

FIGS. 8A and 8B show timing diagrams for operating the illustrative image sensor pixel shown in FIG. 7A. FIG. 8A shows a timing diagram for image signal generation operation. FIG. 8A includes period TA (similar to T0 of FIG. 6A), during which control signal RST_PD may be asserted to reset photodiode 50 to a supply voltage level. During period TA, control signals RST_LG and TX_LG may also be asserted to reset storage region 57 and capacitor 88 to the reset voltage level. During period TB (similar to T1 of FIG. 6A), photodiode 50 may begin to generate image signals corresponding to incident light in multiple distinct integration periods. Distinct image signals generated during the distinct integration periods may be continually summed at storage structure 57 by asserting control signal TX1 for transistor 54.

More specifically, period TB may include periods t, t', and t". After photodiode 50 is reset in period TA, period t may start during which control signals RST_PD and TX1 are both deasserted. During period t, photodiode may receive incident light (e.g., receive light exposure) and generate a corresponding image signal. After a desired length of time for light exposure, period t ends and period t' may begin. During period t', control signal TX1 may be asserted to transfer the corresponding image signal to storage structure 57. Additional image signals generated at photodiode 50 during t' may also be transferred to storage structure 57. As a result, the integration time period may begin at the beginning of period t and ends when period t' ends. In other words, the integration time period may be the sum of time periods t and t'. After the corresponding image signal has been transferred, period t' ends and period t" may begin. During period t", control signal TX1 may be deasserted and control signal RST_PD may be asserted. Photodiode 50 is reset once again, such that period $t_1$" may begin. Periods $t_1$, $t_1$', and $t_1$" may occur similar to periods t, t', and t", respectively. In general, any desired number of periods $t_n$, $t_n$', and $t_n$" may occur. During period $t_n$', image signals generated during periods $t_1$ to $t_n$ are all summed at storage structure 57. After the desired number of periods have occurred, period TB may end.

During period TB, if at any time, the image signals stored at storage structure 57 exceeds the voltage threshold set by transistor 78, a portion of the image signals may be stored at capacitor 88 as a low gain image signal.

At the end of period TB, the low gain signal may be stored at capacitor 88 and the high gain signal may be stored at storage structure 57. Period TC may begin by asserting control signals TX_ST and RST_FD. When control signal TX_ST is asserted, the high gain signal stored at storage structure 57 may be transferred to storage structure 82. When control signal RST_FD is asserted, floating diffusion region 84 may be reset to the reset voltage level. After the floating diffusion region 84 is reset, control signal RST_FD may be deasserted and control signal CNT_LG may be asserted to transfer the low gain signal to floating diffusion region 84 for readout.

FIG. 8B shows a timing diagram for image signal readout operation. During period TD (similar to T3 of FIG. 6B), the low gain signal stored at floating diffusion node 84 may be readout by asserting control signal SEL. When control signal SEL is asserted, an image pixel output corresponding to the low gain signal is generated. The image pixel output corresponding to the low gain signal may be sent to sample and hold circuitry by enabling SHS_LG. Control signals SEL and SHS_LG may be deasserted following readout of the low gain signal. During period TE, the floating diffusion region 84 may be reset to the reset voltage level by asserting control signal RST_FD. The reset voltage level may be read out similarly by asserting control signal SEL. Sample and hold circuitry may store the reset voltage level by asserting control signal SHR. During period TF (similar to T5 of FIG. 6B), the high gain signal may be transferred to floating diffusion region 84 by asserting control signal TX2. The high gain signal may be similarly readout by asserting control signal SEL. Sample and hold circuitry may store an image pixel output corresponding to the high gain signal by asserting control signal SHS_HG. Floating diffusion region 84 may be reset once more following high gain signal readout by asserting control signal RST_FD.

The operation of pixel 22 in both FIGS. 5 and 7 as shown in FIGS. 6B and 8B may have a readout process that includes a low gain signal readout that is a double sampling readout with image signal and reset voltage level. Since reset voltage level readout occurs after low gain signal readout, the double sampling readout is with uncorrelated noise. Alternatively, the low gain signal readout may be correlated with external offset calibration data. The readout process also includes a high gain signal readout that is a correlated double sampling readout with correlated noise between reset voltage level and high gain signal. Pixel 22 as shown in FIGS. 5A and 5B achieves the readout process including two double sampling readout that is operable in global shutter mode with only one source follower transistor. In certain pixels, more than one source follower transistor may be used to enable the pixel to operate in global shutter mode. In pixel 22, floating diffusion 84 acts as pixel sample and hold circuitry, removing the need for the additional source follower transistor and accompanying readout circuitry. This provides additional pixel area that can be used for the pixel photodiode.

Additionally, the operation of pixel 22 in the previously mentioned embodiments shows an implementation of an electrical neutral density filter functionality. More specifically, the photodiode, the photodiode reset transistor, and the charge transfer transistor that transfers generated charge to a charge storage structure allows for the electrical neutral density filter functionality. In other words, the aforementioned structures of pixel 22 implement an electrical neutral density filter. During pixel operation, the integration time is effectively reduced without worsening motion blur. This allows the image generated from pixel 22 to obtain the benefits of generating an image with a physical neutral density filter in the optical path, while not using a physical neutral density filter.

Figure 9:
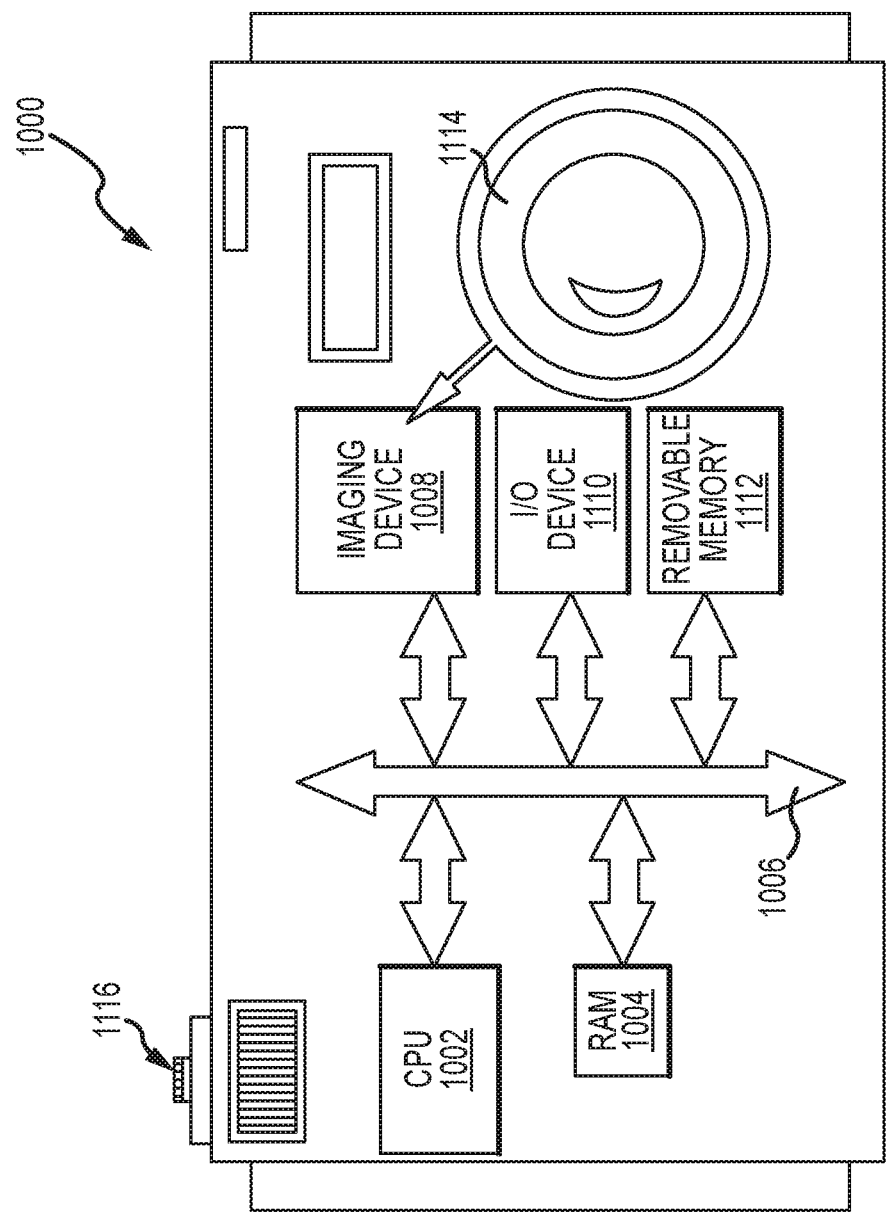
FIG. 9 is a block diagram of a processor system employing the embodiments of FIGS. 1-8 in accordance with an embodiment.

FIG. 9 is a simplified diagram of an illustrative processor system 1000, such as a digital camera, which includes an imaging device 1008 (e.g., the camera module of FIG. 1) employing an imager having pixels as described above in connection with FIGS. 1-8. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1000, for example a digital still or video camera system, generally includes a lens 1114 for focusing an image onto one or more pixel arrays in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it may be one or more busses, bridges or other communication paths used to interconnect system components of system 1000.

Various embodiments have been described illustrating systems and methods for generating images using image sensor pixels having high dynamic range functionalities.

The image sensor pixel may include a photodiode, a charge storage region, a floating diffusion node, and a capacitor. A first transfer transistor may be coupled between the photodiode and the charge storage region. A second transistor may be coupled between the charge storage region and the floating diffusion node. A gain select transistor may be coupled between the capacitor and the floating diffusion node. The photodiode may generate image signals corresponding to incident light. The photodiode may generate distinct image signals from distinct integration periods. Multiple distinct image signals may be integrated at the charge storage region to generate an integrated image signal. The second transistor may determine a portion of the integrated image signals temporarily stored at the charge storage region that may be sent to the capacitor for storage.

The portion of the image signals that is sent to the capacitor may be a low gain signal, and the rest of the image signals may be a high gain signal. A high dynamic range image may be constructed using the low gain signal and high gain signal. The image sensor pixel may also include first and second reset transistors that couple first and second voltage supplies to the photodiode and floating diffusion node, respectively. The image sensor pixel may also include readout circuitry that is configured to readout signals stored at the floating diffusion node in a double-sampling readout operation.

In an alternative embodiment, the image sensor pixel may include a photodiode that generates charge in response to incident light. The image sensor pixel may include first, second, and third charge storage regions. The image sensor pixel may include a first transistor that is configured to transfer the generated charge from the photodiode to the first charge storage region and a second transistor that is configured to transfer a first portion of the generated charge from the first charge storage region to the second charge storage region. The image sensor may include third and fourth transistors that are configured to transfer a second portion of the generated charge from the first charge storage region to the third charge storage region. The image sensor pixel may include a first voltage supply with a first supply voltage and an anti-blooming transistor that is coupled between the first voltage supply and the photodiode. The image sensor pixel may include a fifth transistor that is coupled between the second charge storage region and the third charge storage region. The image sensor pixel may include a second voltage supply with a second supply voltage and a first reset transistor that is configured to reset the first, second, and third charge storage regions to the second supply voltage. The image sensor pixel may include a second reset transistor that is interposed between the second voltage supply and the third charge storage region.

Additionally, the second charge storage region may be a capacitor, and the third charge storage region may be a floating diffusion region. The image sensor pixel may include a sixth transistor. When fifth and sixth transistors are asserted, a first portion of charge is transferred from the capacitor to the floating diffusion region. The image sensor pixel may include a gain select transistor and a low gain transistor, which are configured to transfer the first portion of the generated charge from the second storage region to the third charge storage region. The image sensor pixel may include a reset transistor that is configured to reset the second and third charge storage regions to a reset voltage level.

The image sensor pixel may also include a fourth charge storage region interposed between the third and fourth transistors. The image sensor pixel may include readout transistor circuitry that is configured to perform readout operations and that has an input terminal, wherein the third charge storage region is coupled to the input terminal. The first portion of the generated charge may be a low gain signal. The second portion of the generated charge may be a high gain signal. The image sensor pixel may be configured to operate in a global shutter mode.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel, comprising:
    a photodiode configured to generate charge in response to light;
    a floating diffusion region;
    a first charge storage structure coupled to a first path between the photodiode and the floating diffusion region;
    a second charge storage structure coupled to a second path between the photodiode and the floating diffusion region;
    a transistor interposed between the first charge storage structure and the floating diffusion region; and
    an additional transistor coupled between the photodiode and the first charge storage structure and configured to set an overflow charge barrier, wherein the first charge storage structure is configured to receive a portion of the generated charge determined by the overflow charge barrier.

2. The image sensor pixel defined in claim 1, further comprising:
    a first transfer transistor coupled between the photodiode and the second charge storage structure; and
    a second transfer transistor coupled between the second charge storage structure and the floating diffusion region.

3. The image sensor pixel defined in claim 1, wherein the first charge storage structure comprises a capacitor, the portion of the generated charge forms a low gain signal, and the transistor is configured to transfer the low gain signal from the capacitor to the floating diffusion region.

4. The image sensor pixel defined in claim 1, further comprising:
    a reset transistor, wherein the reset transistor and the transistor are coupled between a voltage supply source and the floating diffusion region.

5. The image sensor pixel defined in claim 1, further comprising:
    a connection transistor, wherein the connection transistor and the transistor are coupled between the first charge storage structure and the floating diffusion region.

6. The image senor pixel defined in claim 1, wherein the first charge storage structure comprises a capacitor.

7. The image sensor pixel defined in claim 1, further comprising:
    a third charge storage structure coupled between the photodiode and the first charge storage structure and between the photodiode and the second charge storage structure.

8. The image sensor pixel defined in claim 7, wherein the third charge storage structure is configured to integrate the charge with additional charge generated by the photodiode.

9. The image sensor pixel defined in claim 1, wherein the first and second paths includes respective portions that are parallel paths between the photodiode and the floating diffusion region.

10. The image sensor pixel defined in claim 1, wherein the transistor is interposed between a voltage source and the floating diffusion region.

11. The image sensor pixel defined in claim 1, wherein the overflow charge barrier comprises a voltage threshold set by the additional transistor.

12. A method of operating an image sensor having an image pixel that includes a photodiode, a floating diffusion region, a charge storage structure interposed between the photodiode and the floating diffusion region, and an additional charge storage structure interposed between the photodiode and the floating diffusion region, the method further comprising:
    at the photodiode, generating charge in response to incident light;
    at a transistor interposed between the photodiode and the charge storage structure, setting a voltage threshold;
    at the charge storage structure, storing a portion of the charge determined by the voltage threshold; and
    at the additional charge storage structure, storing a remaining portion of the charge, wherein the portion of the charge comprises a low gain signal, and the remaining portion of the charge comprises a high gain signal.

13. The method defined in claim 12, further comprising:
    generating a high dynamic range image based on the portion of the charge determined by the voltage threshold and the remaining portion of the charge.

14. The method defined in claim 12, wherein generating charge in response to incident light comprises generating the charge during a plurality of separate integration periods.

15. The method defined in claim 14, further comprising:
    at the additional charge storage structure, summing at least some portions of the charge generated during the plurality of separate integration periods.

16. An image sensor pixel, comprising:
    a photosensitive region configured to generate, in response to light, a first charge during a first integration time period and a second charge during a second integration time period;
    a first charge transfer transistor configured to transfer the first and second charges from the photosensitive region to a charge storage structure, wherein the charge storage structure is configured to generate a summed charge based on the first and second charges;
    a second charge transfer transistor configured to generate an overflow charge based on the summed charge; and
    an additional transistor configured to reset the photosensitive region to a reset voltage between the first and second integration time periods.

17. The image sensor pixel defined in claim 16, further comprising:
    a capacitor configured to receive the overflow charge via the second charge transfer transistor.

18. The image sensor pixel defined in claim 17, wherein the second charge transfer transistor is configured to provide an overflow threshold, and the overflow threshold generates the overflow charge by determining an overflow portion of the summed charge.

19. The image sensor pixel defined in claim 16, further comprising:
    a gain select transistor, wherein the gain select transistor is configured to transfer the overflow charge to a floating diffusion region.

* * * * *